United States Patent [19]

Ghosh et al.

[11] 4,049,478
[45] Sept. 20, 1977

[54] UTILIZATION OF AN ARSENIC DIFFUSED EMITTER IN THE FABRICATION OF A HIGH PERFORMANCE SEMICONDUCTOR DEVICE

[75] Inventors: Hitendra N. Ghosh, Poughkeepsie, N.Y.; Madhukar L. Joshi, Essex Junction, Vt.; Tsu-Hsing Yeh, Poughkeepsie, N.Y.

[73] Assignee: IBM Corporation, Armonk, N.Y.

[21] Appl. No.: 638,496

[22] Filed: Dec. 8, 1975

Related U.S. Application Data

[63] Continuation-in-part of Ser. No. 142,820, May 12, 1971, abandoned, which is a continuation of Ser. No. 765,327, Oct. 7, 1968, abandoned.

[51] Int. Cl.$^2$ .................... H01L 21/223; H01L 21/20
[52] U.S. Cl. .................................. 148/187; 29/576 R; 29/578; 148/1.5; 148/186; 148/189; 357/63; 357/88; 357/89; 357/90
[58] Field of Search ................ 148/1.5, 186, 187, 189; 357/63, 88–90; 29/576, 578

[56] References Cited

U.S. PATENT DOCUMENTS

| | | | |
|---|---|---|---|
| 3,455,748 | 7/1969 | Lindmayer et al. | 148/186 X |
| 3,477,886 | 11/1969 | Ehlenberger | 148/187 |
| 3,484,313 | 12/1969 | Tauchi et al. | 148/187 |
| 3,600,241 | 8/1971 | Doo et al. | 148/187 X |
| 3,607,468 | 10/1968 | Chang et al. | 148/186 |
| 3,638,081 | 1/1972 | Lloyd | 357/90 X |
| 3,707,410 | 12/1972 | Tauchi et al. | 148/187 |
| 3,713,908 | 1/1973 | Agusta et al. | 148/187 X |
| 3,852,127 | 12/1974 | Lamming | 148/187 |

OTHER PUBLICATIONS

Magdo et al., "Ultra High Speed Transistor" I.B.M. Tech. Discl. Bull., vol. 13, No. 6, Nov. 1970, pp. 1423–1424.

*Primary Examiner*—L. Dewayne Rutledge
*Assistant Examiner*—W. G. Saba
*Attorney, Agent, or Firm*—Thomas F. Galvin; George O. Saile

[57] ABSTRACT

A substantially square N-type impurity distribution profile in a silicon substrate produces much superior dc and ac characteristics in PN junction devices than can be expected from the usual phosphorus distribution profile. Such a square profile is obtained by diffusion of arsenic in the silicon substrate. The sharper impurity gradient allows a relatively low surface concentration to be used for the device. This lower surface concentration relieves precipitation and dislocation problems.

4 Claims, 10 Drawing Figures

UTILIZATION OF AN ARSENIC DIFFUSED EMITTER IN THE FABRICATION OF A HIGH PERFORMANCE SEMICONDUCTOR DEVICE

This is a Continuation-in-Part of copending application Ser. No. 142,820, filed May 12, 1971 now abandoded, which is a continuation of application Ser. No. 765,327, filed Oct. 7, 1968, abandoned.

BACKGROUND OF THE INVENTION

1. Cross References

Method of Forming Shallow Junction Semiconductor Devices by Joseph J. Chang, et al. filed concurrently with the present patent application and having Ser. No. 765,328, filed Oct. 7, 1968, now U.S. Pat. No. 3,607,468. Said application also divided into application Ser. No. 135,680, and now U.S. Pat. No. 3,778,687.

Heterogenous Integrated Circuits by M. C. Duffy, et al., Ser. No. 750,650, filed Aug. 6, 1968, now U.S. Pat. No. 3,655,457.

2. Field of Invention

This invention relates to a semiconductor structure and method for forming a shallow junction semiconductor device that has particularly high electrical performance and more particularly to a N-type emitter structure which allows this superior performance.

DESCRIPTION OF THE PRIOR ART

Silicon is the most widely used semiconductor material and is almost exclusively used in the fabrication of monolithic or integrated semiconductor devices. NPN transistors have also found wide usage particularly in monolithic or integrated device structures. Boron is the most generally used impurity for the base region. Phosphorus is almost exclusively used for the emitter. In the present state of the art in order to fabricate high speed devices, workers in the art have gone to increasingly shallower devices with respect to the silicon surface, more narrow base widths, and increasingly higher surface concentrations of phosphorus.

Higher surface concentration of phosphorus diffusion will generate dislocation and precipition. These conditions cause degradation of device electrical characteristics. With these shallower devices, the "push-out" effect of the base-collector junction is more pronounced and the expected result of narrow base width is not obtained. Because phosphorus atomic size is smaller than silicon, a certain amount of strain is generated in the lattice. This strain also contributes to reduction of performance of the devices.

SUMMARY OF THE INVENTION

It is an object of the invention to provide a new transistor structure having device characteristics which are substantially superior to that of the prior art. These important characteristics are: Speed, large band width with low noise, current gain with high $f_t$, workable junction depth, more reproducible electrical characteristics, and sharper base-emitter forward transistor characteristics. These and other objects are accomplished in accordance with the broad aspects of the present invention by providing a high performance PN semiconductor device that has a P region and an N region having a substantially square N-type diffused impurity distribution profile formed in the P region. The N region having an N-type impurity surface concentration greater than about $10^{20}$ atoms per $cm^3$. The N region distribution profile has substantially a constant N-type impurity concentration extending from the surface until the P-N junction is reached. This characteristic, coupled with the surface concentration and the use of, in the case of a NPN transistor device, a narrow base P-type base region produces substantially better AC and DC electrical device characteristics. The N region impurity distribution profile is obtained by thermally diffusing arsenic. The base region can be composed of any suitable P-type base dopant such as boron and gallium.

The foregoing and other objects, features and advantages of the invention will be apparent from the following more particular description of the preferred embodiments of the invention as illustrated in the accompanying drawings.

DESCRIPTION OF THE PREFERRED EMBODIMENTS

Figure 1:
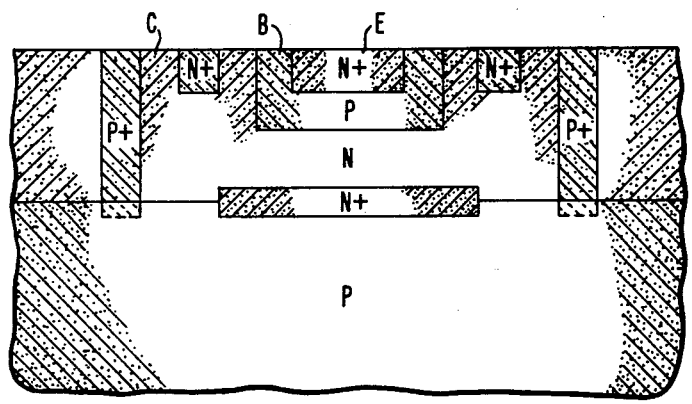
FIG. 1 shows a typical cross-section of a semiconductor device.

A computer program was used to generate the profile from the diffusion parameters. The inputs to the program are: total length of the transistor in microinches, $\mu$ inches, distance from the surface at which the base midpoint is located in microinches, $\mu$ inches, integration interval in microinches, $\mu$ inches, area in $cm^2$, error allowed in electric field, $\psi$, temperature in degrees Kelvin, maximum number of iterations allowed for a solution, initial bias for $V_{eb}$ and $V_{cb}$. The following inputs are available in program form: left hand and right hand boundaries of the emitter and collector junctions measured from the mechanical junction in cm at zero bias, emitter and collector junction built-in voltages. Finally the diffusion process input parameters are; background concentration, final or initial surface concentration for the base and emitter diffusions, collector and emitter junction depths in microinches, $\mu$ inches. Standard outputs are the total minority carrier current, total majority carrier current at the emitter and collector, $V_{eb}$, $V_{cb}$ and total capacitance due to the emitter junction voltage bias, Optional outputs are: electronic potential, electric field, hole and electron quasi-Fermi levels, total hole and electron carrier densities, impurity profile, and a plot of the electric field, $\psi$, quasi-Fermi level for holes, $\phi_p$, and quasi-Fermi level for electrons, $\phi_n$, versus distance.

One of the most interesting insights revealed by this analysis is related to the $I_c$ vs $V_{be}$ characteristic. The doping of the emitter side of the junction influences the exponential dependence on junction voltage of the junction current. The program predicts $I_e$ vs $V_{be}$ characteristics for double diffused-shallow transistors which depart from the usual $I_s [\exp(q^Vbe/RT) - 1]$ relationship, at relatively low injection levels. To illustrate this behavior, runs were made for the profile generated by the program for a shallow transistor with an integrated base doping of $6.268 \times 10^{12}/cm^2$. Modifications on the emitter and base regions impurity distribution of this profile were made so as to highlight the corresponding variations in the $I_e$ vs $V_{be}$ characteristics while simultaneously keeping the integrated base doping and the mechanical base width at their original values. The different cases treated were:

CASE I

Profile generated by the program for the following parameters:

Surface concentration = $10^{21}/cm^3$, surface concentration of second impurity (boron) CS2 = $1.5 \times 10^{19}/cm^3$, background doping of collector CB = $8.6 \times 10^{16}/cm^3$, emitter junction depth $X_{je} = 19\mu$ inches, collector junction depth $X_{jc} = 30\mu$ inches, total emitter area $3.534\ cm^2$, injecting emitter area $2.19\ cm.$, sheet resistivity $\rho_\square = 6\ K\Omega$.

CASE II

Base doping and structural base width left unchanged from Case I. Emitter doping was constant at $4 \times 10^{20}/cm^3$. Table I shows a comparison between the I-V characteristics obtained for the above cases using above computer program. Table I. Comparison of emitter diode characteristics for different profiles.

| $V_{be}$ (volts) | (Emitter Current in ma Case I | Emitter Area = $2.19 \times 10^{-6}\ cm^2$) Case II |
|---|---|---|
| .7006 | 0.0472 | 0.0983 |
| .7597 | 0.394 | 0.8265 |
| .820 | 3.98 | 8.203 |
| .839 | 7.50 | 16.00 |

Table I indicates that as the emitter profile is made flat and sharp, then $I_e$ vs $V_{be}$ characteristic approaches the ideal diode characteristic computed taking into consideration only the base region as shown by exponential relationship of $I_e$ and $V_{be}$.

Table II

Figure 2:
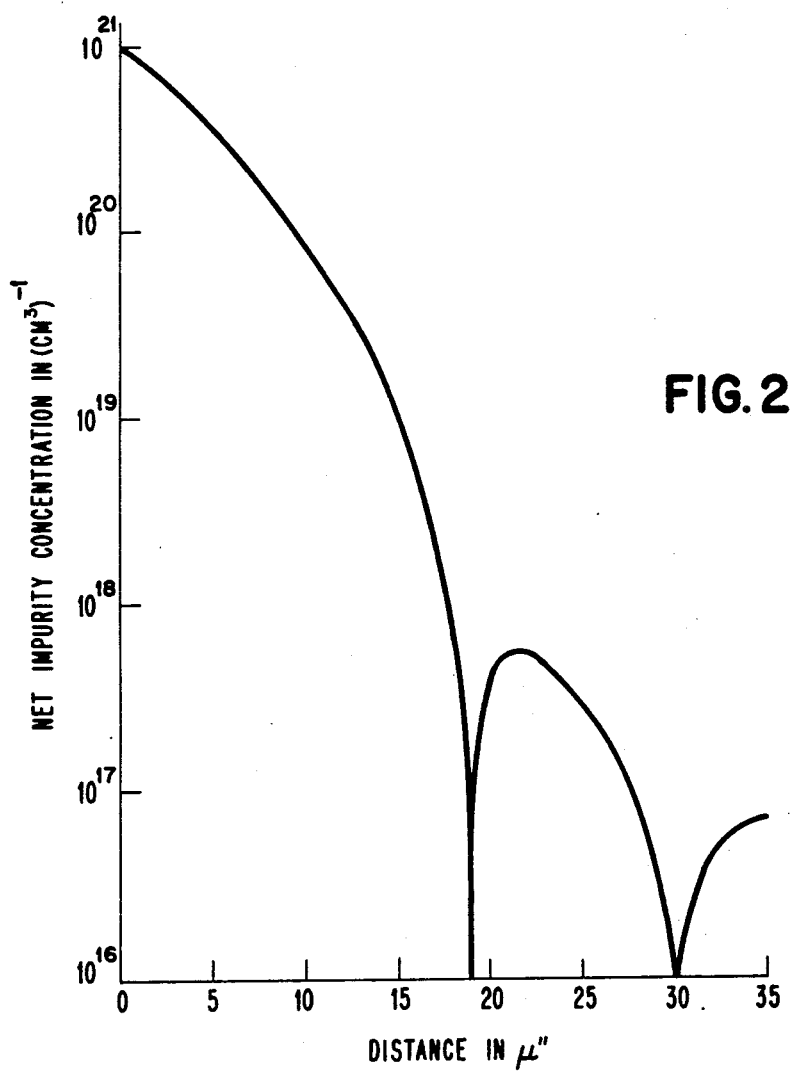
FIG. 2 and 3 are graphs of impurity concentration versus distance from the semiconductor surface.
Figure 3:
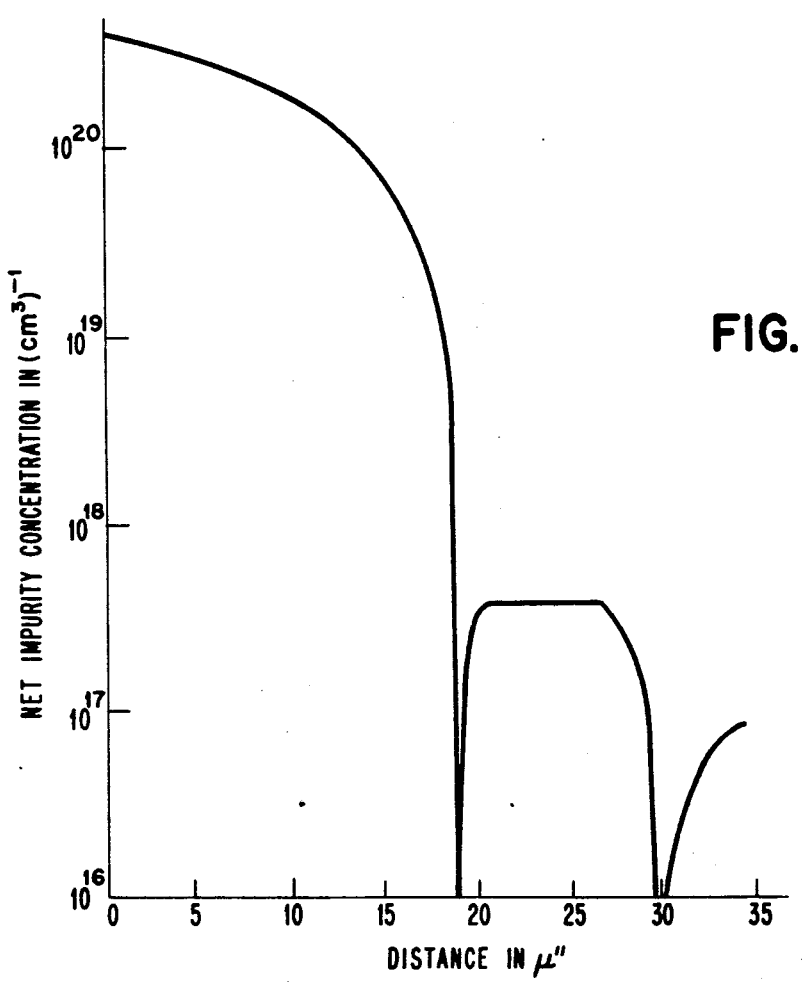

| (A) - Emitter Storage and Junction Capacitance FIG. 2 (transistor number 1) | | | |
|---|---|---|---|
| $V_{be}$ base-emitter breakdown voltage (volts) | $I_e$ emitter current (ma) | $C_e$ emitter storage capacitance (pfd) | $C_j$ emitter junction capacitance (pfd) |
| .759 | .42 | .085 | 1.42 |
| .805 | 2.28 | .479 | 3.00 |
| .819 | 3.85 | .844 | 4.06 |
| .825 | 4.76 | 1.08 | 4.64 |
| .839 | 7.78 | 1.78 | 6.10 |
| .849 | 10.90 | 2.54 | 7.53 |
| (B) - Flat Profile - FIG. 3 (transistor number 2) | | | |
| .759 | .52 | .009 | .84 |
| .805 | 2.96 | .051 | 1.88 |
| .819 | 5.04 | .092 | 2.54 |
| .825 | 6.20 | .118 | 2.91 |
| .839 | 10.10 | .195 | 3.82 |
| .849 | 12.98 | .286 | 4.72 |

To further emphasize the possibilities made available by changing the profile, a special profile was generated with a very gentle gradient in the emitter region, and the same average base doping and junction depths of transistor number 1 of FIG. 2. In practice, this profile is obtained if the emitter is made using diffusion of arsenic impurities. This profile is shown in FIG. 3 and is designated transistor number 2. As expected, the gradient of the electrical field $\psi$ for transistor number 2 is less steep than for transistor number 1, the corresponding field intensity being less strong in the emitter region. On the other hand, as the junction is approached, the field jumps and becomes stronger than for the transistor number 1, which reflects the steeper junction impurity gradient of transistor number 2. From this description, we conclude that the emitter and junction capacitances for this profile ought to be less than for transistor number 1. Computations in Table IIA and Table IIB above corroborate this conclusion.

Flat emitter impurity profile with sharp fall-off has been shown to result in high switching speed of higher frequency performance of bi-polar transistors, i.e. sharper diode characteristics, higher $f_t$ gain bandwidth, lower base resistance higher current gain, Beta, higher punch-through voltage. One way to produce such impurity distribution is to use an impurity like arsenic which has the property that its diffusivity strongly increases with doping concentrations.

Figure 4:
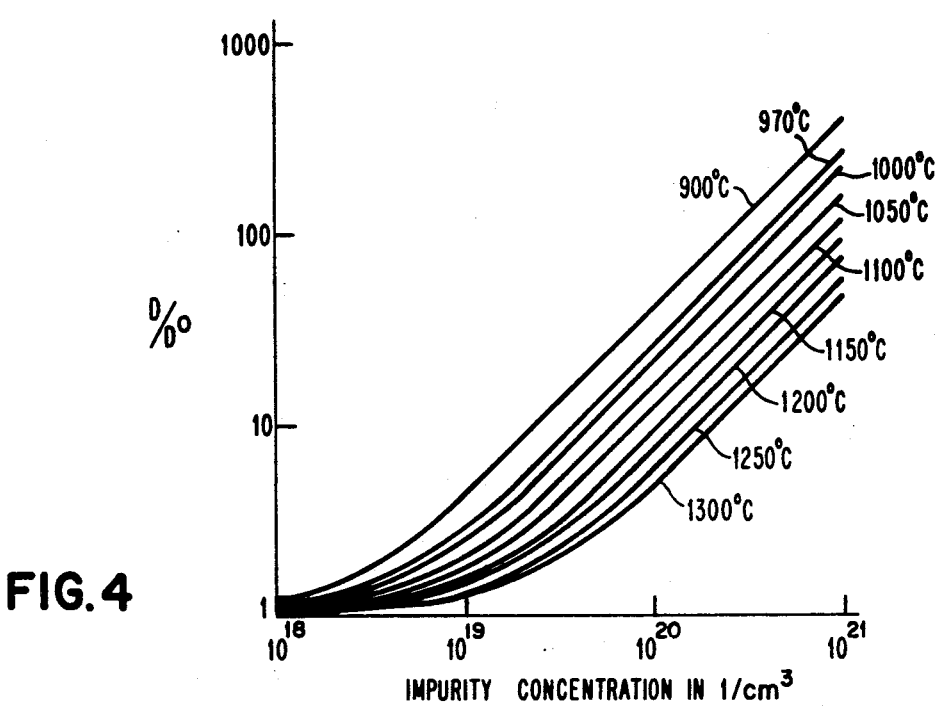
FIG. 4 is a graph showing concentration dependency of arsenic diffusivity in silicon.

Two primary effects contributing to this concentration dependency of diffusivity are the following: 1) the ionization of the distributed impurities gives rise to an internal electrostatic field which acts as a driving force; 2) diffusion of Group V impurities into vacancy sites in the lattice. Such concentration dependency is shown in FIG. 4. A transistor structure involves three diffusants which can be diffused sequentially or simultaneously. For example, arsenic emitter and boron base can be formed simultaneously or sequentially with base diffusion followed by emitter or vice-versa, with similar effects in all cases. For sequential diffusion, an acceptor (or donor) impurity is diffused into a silicon substrate containing opposite type of impurity donor (or acceptor). If the impurity level in the substrate is uniform and equals the background doping of collector $C_B$, the impurity distribution will be given by the solution to the following continuity equation for a onediffusant system in one dimension under appropriate boundary condition:

$$\frac{\delta c}{\delta t} = \frac{\delta}{\delta x}\left[D(c)h\frac{\delta c}{\delta x}\right] \quad (1)$$

where
 $x$ = distance
 $t$ = time
 $c$ = concentration
 $D(c)$ = diffusivity as a function of concentration $$h = 1 + c\frac{\delta \ln f}{\delta c}, \quad 1 \leq h \leq 2$$
 = electric field term $f$ = function of diffusing impurity concentration and background doping, $C_B$ With a system of two impurities of opposite type, the solutions to the following simultaneous equations of continuity will describe the distributions of both impurities.

(2)

$$\frac{\delta c_1}{\delta t} = \frac{\delta}{\delta x} D_1 \left[ h_1 \frac{\delta c_1}{\delta x} - (h_1 - 1) \frac{\delta c_2}{\delta x} \right] \quad (3)$$

$$\frac{\delta c_2}{\delta t} = \frac{\delta}{\delta x} D_2 \left[ h_2 \frac{\delta c_2}{\delta x} - (h_2 - 1) \frac{\delta c_1}{\delta x} \right]$$

where:

$h_i = 1 + Z_i C_i \frac{\delta \ln f}{\delta c_i}, \ i = 1,2$ $Z_i = +1$ for donor
$Z_i = -1$ for acceptor $D_1$, $D_2$ are dependent on impurity concentrations as dictated by the functional relationship between $f$ and $c$. This relationship is different for acceptor or donor impurities.

Consider, for example, the diffusion of a donor, component 2, into a medium containing a uniform background concentration of $C_3$ of another donor, in the presence of an existing acceptor profile $C_1(x, o)$. The continuity equations are:

$$\frac{\delta C_1}{\delta t} = D_1{}^0 \frac{\delta}{\delta x} \left[ h_1 \frac{\delta C_1}{\delta x} - (h_1 - 1) \frac{\delta C_2}{\delta x} \right] \quad (4)$$

$$\frac{\delta C_2}{\delta t} = D_2{}^0 \frac{\delta}{\delta x} \left[ f h_2 \frac{\delta C_2}{\delta x} - f(h_2 - 1) \frac{\delta C_1}{\delta x} \right] \quad (5)$$

It can be seen that the strong interaction comes from the second term in the right-hand side of Eq. (1).
In the equations above we have defined $$f = \frac{C_2 - C_1 + C_3}{2Ni} + \sqrt{\frac{(C_2 - C_1 + C_3)^2}{2Ni} + 1} \quad (6)$$

$$h_1 = 1 + C_1[(C_2 - C_1 + C_3)^2 + 4Ni^2]^{-1/2} \quad (7)$$

$$h_2 = 1 + C_2[(C_2 - C_1 + C_3)^2 + 4Ni^2]^{-1/2} \quad (8)$$

The initial conditions $C_1(x, o)$ are known and $C_2(x, o) = 0$. The boundary conditions are $$\frac{\delta C_1}{\delta x} = \left(1 - \frac{1}{h_1}\right) \frac{\delta C_2}{\delta x} \text{ at } x = 0, \text{ at all } t; \quad (9)$$

$c_2(o, t) = (C_{02}$ at all $t$; $\quad (10)$ $c_1(x, t) = C$ as $x \to \infty$, at all $t$; $\quad (11)$ $c_2(x, t) = o$ as $x \to \infty$, at all $t$. $\quad (12)$ From Equations (4) and (5) note the interaction between base and emitter impurity profiles resulting into shallower emitter-base junction depth than what is obtained by simple superposition of base and emiter impurity profiles as shown in FIG. 5.

Figure 5:
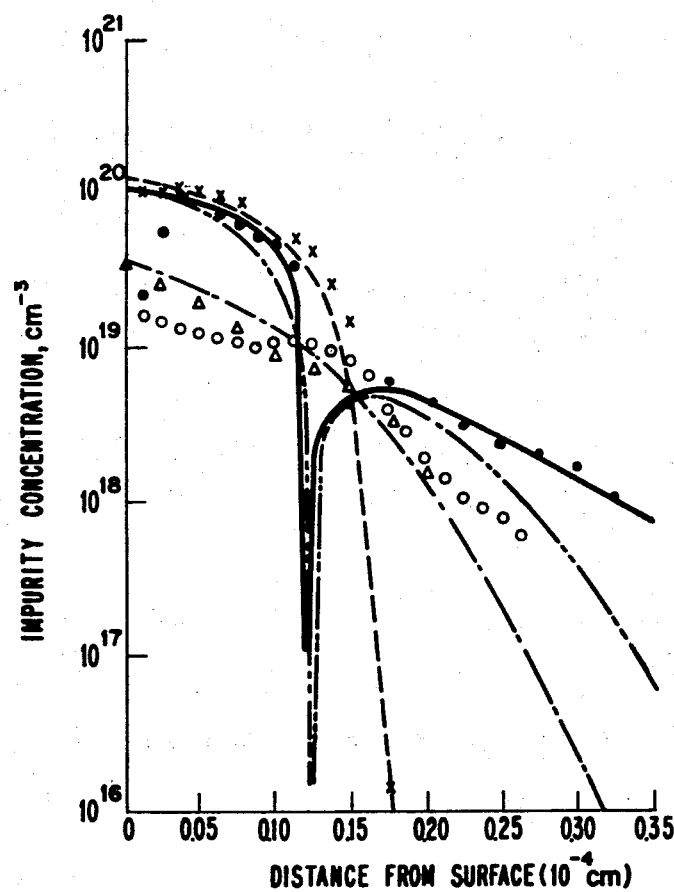
FIG. 5 is a comparison of computed and measured transistor profiles by sequential diffusion process and non-interacting emitter profiles.

For a specific transistor process using Boron as base impurity and arsenic as emitter impurity, an experimental verification of the effects claimed in this disclosure has been shown in FIG. 5 by comparing computed profile with measured impurity distribution of the following measured process parameters.

Base Diffusion — boron capsule
$C_{01} = 3.8 \times 10^{19}$ cm$^{-3}$
$t = 100$ minutes
$T = 1273°$ K
$C_3 = 5.2 \times 10^{15}$ cm$^{-3}$ = background doping level
$D_1° = 0.52 \times 10^{-14}$ cm$^2$/sec.

Arsenic Diffusion
$t = 60$ minutes
$T = 1273°$ K
$D_2° = 0.9 \times 10^{-15}$ cm$^2$/sec.
$C_{02} = 1.3 \times 10^{20}$ cm$^{-3}$ in test wafer
$C_{02} = 1.5 \times 10^{20}$ cm$^3$ in transistor
$x_j = 0.175 \times 10^{-4}$ cm in test wafer (arsenic diffused along)
$x_j = 0.125 \times 10^{-4}$ cm in transistor The results of the computation are shown in FIG. 5, together with the experimental data. It can be seen that the computed profiles compare quite well with the experimental profile, particularly the arsenic profile in the test wafer and the transistor profile. Both $\rho_\square$, sheet resistivity, of the base region under emitter and collector junction measurements in the test wafer and in the transistor agree with the computation.

In FIG. 5 the following identifies the curves:

| Capsule Process: | Arsenic Emitter Boron Base |
|---|---|
| — · — · — | Transistor profile calculated by the diffusion process model as described by the equations (4–12). |
| • • • • | Transistor profile, measured by the incremental sheet conductance method. |
| - - - - - - - | Emitter profile diffused alone calculated by the model in Equation 1. |
| xxxxxxx | Emitter diffused alone, measured by the incremental sheet conductance method. |
| — — — | Initial base profile, calculated by model in Equation 1. |
| ▲ ▲ ▲ ▲ ▲ | Initial base, model in Equation 1. Measured by the incremental sheet conductance method. |
| o o o o o | Base diffused alone after heat treatment corresponding to emitter diffusion cycle and measured by incremental sheet conductance method. Note that this redistributed base profile intersects the emitter profile at a deeper junction than what is actually obtained for emitter-base junction by calculation and measurement. |

Figure 6:
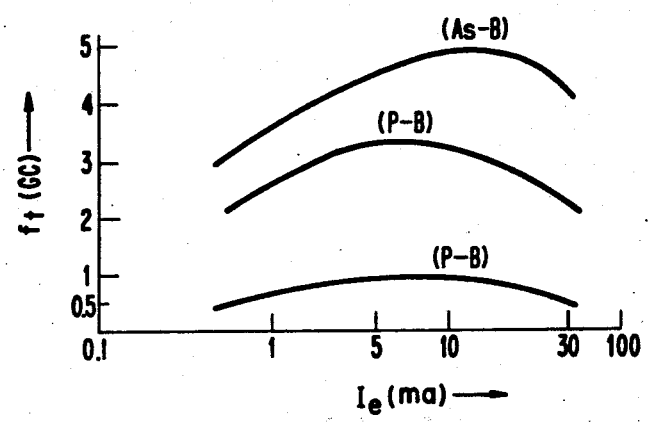
FIG. 6 is a comparison of transistor cutoff frequency $f_t$, versus emitter current for phosphorus-boron devices and arsenic-boron devices.

The FIG. 6 illustrates the vast improvement of transistor cut-off frequency, $f_t$, versus emitter current, $I_e$, by the use of sharp impurity profile of the emitter which is obtained by arsenic, rather than phosphorus diffusion. The two upper curves have identical emitter area. The device represented by the upper curve has shallower junction depths than the next higher curve. However, the upper curve possesses a steeper impurity gradient (2 × 10$^{24}$ cm$^{-4}$ to 10$^{25}$) due to arsenic emitter than the highest phosphorus curve (8 × 10$^{23}$ cm$^{-4}$) which results in the improvement of this electrical characteristic. The lower phosphorus curve represents the $f_t$ characteristic now generally available. To go from the lower to upper phosphorus curve demands the most advanced and complicated phosphorus diffusion process.

Figure 10:
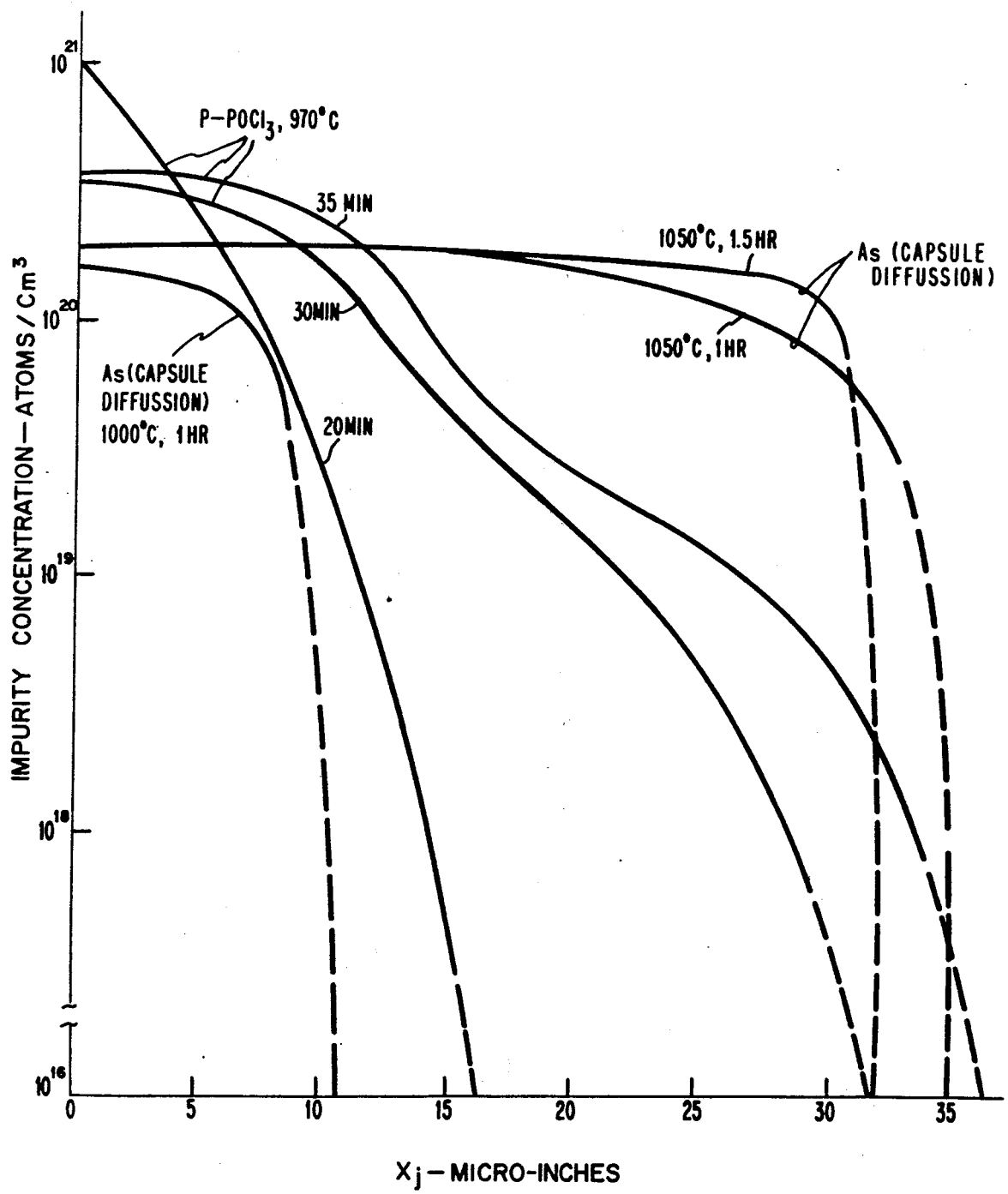
FIG. 10 shows the comparison between emitter profiles for arsenic and phosphorus impurities.

It's well known that the high concentration phosphorus diffusion introduces defects like dislocations and precipitations in the silicon. The density and the character of these defects depend upon the various factors such as: surface concentration, junction depth, temperature of diffusion, the diffusion processes, etc. For shallow emitter junction, less than 15 μin., of phosphorus, even with the highest phosphorus concentration, the dislocation generation in the emitter region is considerably reduced; however it cannot be eliminated. Some of the dislocations almost inevitably enter the base region from all the sides of the junction. Dislocations are known to collect impurities and provide short-circuit paths, for example, PIPES. This affects the reliability of the device. The dislocations which span the base emitter region right were the junction reaches the surface is expected to reduce current gain, $\beta$, of the device. Besides dislocations it is well known that large amounts of discrete precipitates in the form of rods, platlets, parallele-pipedes are introduced during the high concentration phosphorus emitter diffusion. This in turn is expected to lower the yield of products and effect the junction quality. Arsenic, however, is well known for its good lattice match with silicon; consequently, the dislocation generation due to the straining of the lattice does not happen. Extremely small dislocation loops do come into existence during diffusion for reasons other than mismatch strain. These dislocation loops are observed through transmission electron microscope to be sessile type and are mostly within two-thirds of the diffused region and are one-third distance away from the junction. Such dislocations cannot move easily during diffusion or other processing steps at high temperature. Consequently they do no penetrate the junction at all sides. The high density of Sessile loops is expected to give almost a square profile through impurity absorption. Such square profile with very steep slopes at the junction are actually observed in FIG. 10 which gives electrical impurity profile. One sees that within greater than about 80% of the As diffused junction the concentration of As drops only about one order of magnitude, i.e. from $2 \times 10^{20}$ atoms/cm$^3$ at the surface ($x=0$) to $2 \times 10^{19}$ atoms/cm$^3$ at $x$ which is greater than about 80% of the measured junction depth. The rest of the concentration drops within the remaining 10 or 20% of the depth toward the junction, i.e. from $\sim 2 \times 10^{19}$ drops to $\sim 1.7 \times 10^{16}$ atoms/cm$^3$. In the same FIG. 10, several examples of deep and shallow junction formed by the phosphorus diffusion (POCl$_3$ or PH$_3$ process) are given for comparison. With the comparable junction depth and concentration, one sees that within greater than 80% of the phosphorus diffused junction, the phosphorus concentration drops almost exponentially monotonically from $\sim 4 \times 10^{20}$ atoms/cm$^3$ at the surface ($x=0$) to $\sim 10^{18}$ atoms/cm$^3$ at $x$ greater than about 80% of the measured junction depth, i.e. almost two orders of magnitude of impurity concentration.

No discrete precipitation in the form of rods, etc. could be observed through the transmission electron microscopy in the As emitter; consequently the junction quality, the reliability of the product is considerably improved over those devices of phosphorus emitters. Pipes are also not observed in As emitter devices.

Due to base push-out effect with phosphorus as emitter, the doping profile in the base region spreads out causing reduction in the integrated base doping level. This in turn will cause higher base resistance and lower punch-through voltages. These effects would be enhanced as the designed emitter junction depths and the designed base widths tend to become shallower in the vertical geometry of the modern transistor structure. For the high speed shallow logic devices, one needs combinations of narrow base widths (less than 10 microinches) and higher integrated base dopings $3 \times 10^{12}$ atoms per cm$^{+2}$. The combination is very difficult to achieve in practive because of the large push-out effect (between 20 to 40% of collector junction depths) under the emitter. This push-out effect is due to (1) strain, (2) electrical field, (3) plastic deformation, (4) impurity precipitations, (5) base width, (6) temperature, (7) amount of base doping. The strain effects however are known to be a predominant factor with phosphorus. For arsenic this strain factor is minimum because its covalent radius matches well with that of silicon atom. Consequently, even with the highest arsenic concentration in the emitter region, the push-out is extremely small. Consequently, the designed base width with given base resistance is easily achievable with arsenic emitters.

Process yield among other factors depends on the amount of stress and strain caused in the silicon lattice due to introduction of doping impurities. Higher concentration of impurities will, in general, produce more defects in silicon and accentuate the adverse effects line diffusion induced pipes, dislocations, precipitations, etc. These factors cause nonuniform junctions, lowering of breakdown voltages, viz., the junction breakdown and collector-to-emitter punch-thru voltages and more important effect is the reduction of common emitter gain of transistor at such high emitter concentration levels.

Since arsenic has a much stronger dependency of diffusivity on concentration level than phosphorus (which has been used in emitter as prior art), it has been shown a certain impurity gradient at a particular emitter-base junction depth can be produced at a lower emitter surface concentration than is possible with phosphorus. This factor together with the fact that arsenic atom is a better match to silicon atom (i.e. sizes more nearly equal than phosphorus-silicon match) will cause the silicon lattice to be less strained and therefore produce higher speed performance with higher process yield.

For a given surface concentration, higher emitter gradients at the emitter base junction can be obtained for arsenic even at deeper junctions than it is possible with phosphorus. Hence, deeper structures can be made with higher performance and better process advantage with arsenic emitter than with phosphorus emitter.

EXAMPLES 1, 2, and 3

NPN transistor devices were fabricated by conventional techniques to form the structure shown in FIG. 1 up to the emitter diffusion step. At this point three different devices were formed in three different substrates identified as Examples 1, 2, and 3. Examples 1 and 2 used an arsenic capsule source having an impurity of $1.9 \times 10^{21}$ available in the capsule. The wafers at separate times were heated after placing the capsule in a diffusion furnace at 1000° C. In the case of Example 1, 60 minutes time and in the case of Example 2, 80 minutes of time. These diffusion steps for Examples 1 and 2 were followed by a gettering cycle using phosphine at 885° C for 25 minutes. A third silicon wafer, Example 3, had a phosphorus emitter formed by a conventional open tube phosphine diffusion process at a temperature of 885° C for a time of 40 minutes. The electrical characteristics are given in the following table.

|  | Example 1 | Example 2 | Example 3 |
|---|---|---|---|
| As sub collector (in atoms/cm$^3$) | $1.5 \times 10^{21}$ | $1.5 \times 10^{21}$ | $1.0 \times 10^{21}$ |

-continued

| | Example 1 | Example 2 | Example 3 |
|---|---|---|---|
| *xjcμ inch (collector junction depth) | 23.6 | 25 | 25.0 |
| *xjeμ inch (emitter junction depth) | 14.9 | — | 16.0 |
| $W_b \mu$ inch (base width) | 8.7 | — | 9.0 |
| Rdb kΩ /□ (base resistance) | 4–5 | 7.5–9 | 11–13 |
| $F_t$ (GHz) (cut off frequency) | 3.11 | 4.2 | 2.5 |
| β at $I_E$(emitter current)= 10 Amps | 35–40 | 60–75 | 40–60 |

*The accuracy of xjc and xje are limited at best to ± 2μ inches.

Figure 7:
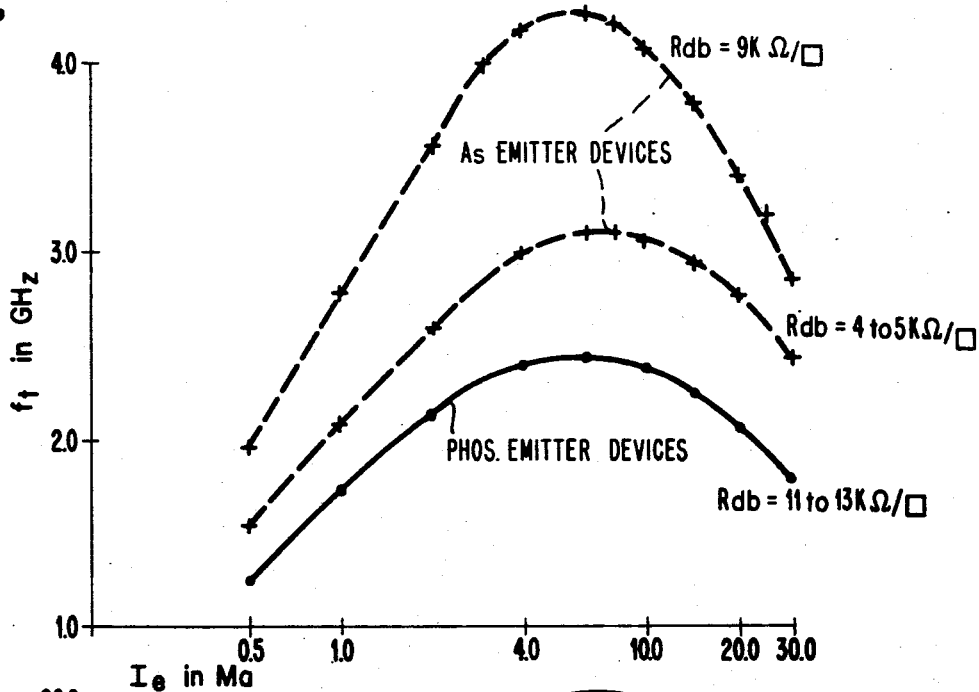
FIG. 7, 8 and 9 are electrical characteristics of devices made according to Examples in the present invention.
Figure 8:
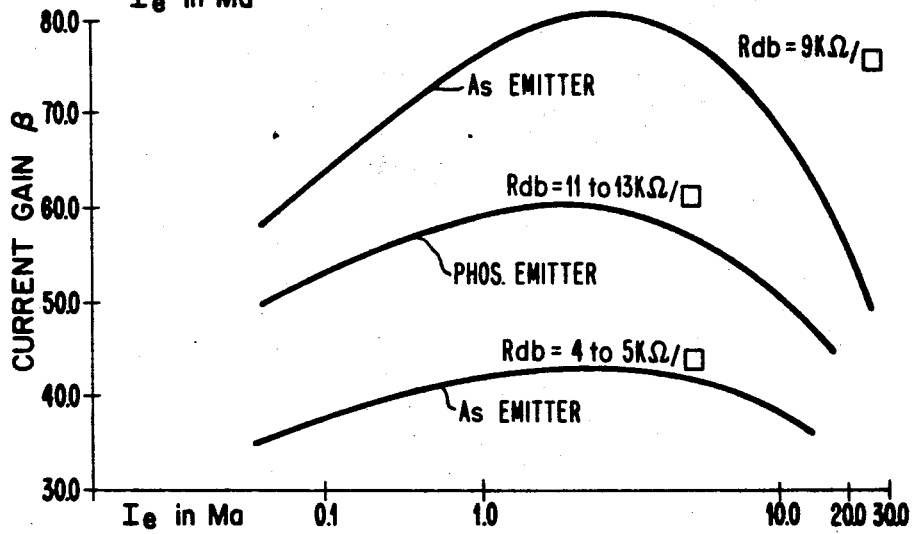

The upper two curves in FIG. 7 show typical gain band width product, $f_t$ plots obtained from the devices with arsenic emitter diffusion and Rdb or 4–5 kΩ and 9K Ω/□. For comparison, the curve in FIG. 7 shows an $f_t$ plot for a phosphorus diffused device with its Rdb in the range 11 to 13k Ω/□. It seems from these preliminary results that the gain width product $f_t$ of the devices is increased by a factor of about 1.7. Current gain, β, of arsenic emitter devices is significantly higher than that of phosphorus emitter devices as shown in FIG. 8. Comparing the upper two curves made in similar device structure, the device measurement indicates that the at $I_e$ = 10 mA, for As emitter devices may be 1.5 times the β of our phosphorus emitter devices. For the lower arsenic emitter curve, the corresponding β of a phosphorus emitter of a similar device structure is only 16 to 20 at $I_e$ = 10 milliamps. The curve is not shown because it is off the scale of the graph. Emitter-base breakdown voltage for As emitter devices was 4.6 to 4.8 volts at $I_e$ = 10 μA as compared with 5.4V for phosphorus emitter devices. As emitter devices have consistently very sharp collector-base breakdowns of approximately 15 – 18 volts. The devices with $f_t$ of 4 to 4.5 GHz were avalanche-limited devices (at 17V). It should be possible to reduce the base width further and this obtain higher $f_t$ and β.

EXAMPLE 4

A silicon structure as shown in FIG. 1 was formed using an arsenic emitter wherein the emitter stripe width was 75 microinches and the emitter base contact spacing was 75 microinches. The collector junction depth was 22 microinches and the base width was approximately 5 microinches. The emitter stripe length was 0.5 mils and 0.7 mils. The following table gives the A.C. and D.C. characteristics of transistors formed by this process.

| | 0.7 mil Emitter | 0.5 mil Emitter |
|---|---|---|
| β at $I_E$ = 10 mA and $V_{CB}$ (collector-base voltage) = 0V | 154 | 128 |
| $f_t$ at $I_E$ = 3.5 mA and $V_{CB}$ = 0.5V | 10.2 GHZ | 9.1 GHZ |
| $R_{bb}C_C$ (base resistance-collector capacitance) at $I_E$ = 10 mA | 4–7 picoseconds | 10 picoseconds |
| $T_e$ (transistor emitter time constant) at $I_E$= 4 mA and $V_{CB}$= 0.5V | 16–18 picoseconds | 17–20 picoseconds |
| $C_{CB}$ (collector-base) (capacitance) at $V_{CB}$ (collector base breakdown voltage) = 0V | 0.118 pf | 0.08 pf |
| $C_{BE}$ (base-emitter capacitance) at $V_{BE}$ (base emitter breakdown voltage) = 0V | 0.088 pf | 0.046 pf |
| $R_C$ (collector bulk resistance) | ≈ 5 ohms | ≈ 5 ohms |

Figure 9:
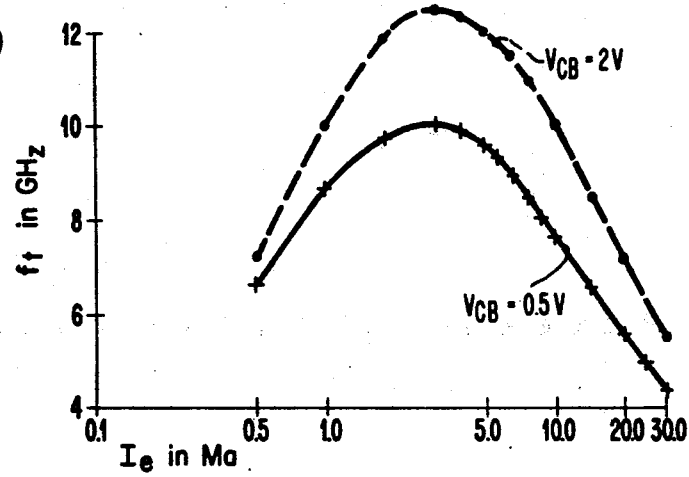

FIG. 9 shows the $f_t$ versus $I_e$ characteristics of these devices, Therefore, it is seen that ultra high speed silicon transistors with $f_t$ of up to 13 GHZ can be fabricated. These devices have propogation delays of 160 picoseconds.

While the invention has been particularly shown and described with reference to perferred embodiments thereof, it will be understood by those skilled in the art that the foregoing and other changes in form and details may be made without departing from the spirit and scope of the invention.

What is claimed is:

1. The mehtod of forming a high performance PN semiconductor device comprising:
   introducing a P-type impurity into a silicon semi-conductor body so as to provide a surface concentration level of greater than about $10^{19}$ atoms per cm³;
   diffusing arsenic within said P-type region so as to provide a surface concentration level of arsenic of greater than about $10^{20}$ per cm³;
   continuing said diffusion step until said arsenic forms a substantially square impurity distribution.

2. The method of forming a semiconductor device of claim 1 wherein said P-type impurity is boron.

3. The method as in claim 1 wherein said diffusion step comprises:
   placing said devices into a diffusion furnace heated to around 1000° C to 1200° C; and
   providing an arsenic capsule source, having an impurity of around $10^{21}$ atoms/cm³ available in said capsule, in said furnace.

4. The method as in claim 3 wherein said diffusing step continues for at least 1 hours.

* * * * *